US 6,695,039 B1

(12) United States Patent
Reyzin et al.

(10) Patent No.: US 6,695,039 B1
(45) Date of Patent: Feb. 24, 2004

(54) ORIENTATION INSENSITIVE THERMOSIPHON ASSEMBLY FOR COOLING ELECTRONIC COMPONENTS

(75) Inventors: Ilya Reyzin, Williamsville, NY (US); Mohinder Singh Bhatti, Amherst, NY (US); Shrikant Mukund Joshi, Williamsville, NY (US); Debashis Ghosh, Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 25 days.

(21) Appl. No.: 10/374,349

(22) Filed: Feb. 25, 2003

(51) Int. Cl.⁷ .............................................. F28D 15/00
(52) U.S. Cl. ........................... 165/104.21; 165/104.33; 361/700; 257/715; 174/15.2
(58) Field of Search ........................ 165/104.21, 104.33, 165/185, 80.4; 361/700; 174/15.2; 257/715, 716

(56) References Cited

U.S. PATENT DOCUMENTS

| | | | |
|---|---|---|---|
| 3,741,292 A | 6/1973 | Aakalu et al. ............... 165/105 |
| 4,313,492 A | 2/1982 | Andros et al. ........... 165/104.26 |
| 5,613,552 A | * 3/1997 | Osakabe et al. ....... 165/104.21 |
| 5,737,923 A | * 4/1998 | Gilley et al. ................... 62/3.7 |
| 5,836,381 A | * 11/1998 | Osakabe et al. ....... 165/104.21 |
| 5,871,043 A | * 2/1999 | Osakabe et al. ....... 165/104.21 |
| 5,886,872 A | 3/1999 | Koenen et al. .............. 361/719 |
| 5,925,929 A | 7/1999 | Kuwahara et al. ........... 257/714 |
| 6,005,772 A | 12/1999 | Terao et al. ................. 361/699 |
| 6,085,831 A | 7/2000 | DiGiacomo et al. ... 165/104.33 |
| 6,257,324 B1 | * 7/2001 | Osakabe et al. ....... 165/104.33 |
| 6,357,517 B1 | * 3/2002 | Osakabe et al. ....... 165/104.33 |

FOREIGN PATENT DOCUMENTS

JP            1-264247 A   * 10/1989   .................. 257/715

* cited by examiner

Primary Examiner—Terrell McKinnon
(74) Attorney, Agent, or Firm—Patrick M. Griffin

(57) ABSTRACT

A thermosiphon assembly for dissipating heat generated by an electronic component using a working fluid is disclosed. The assembly includes an evaporator having a front face, a rear face, and a peripheral wall extending between the front face and the rear face and being arcuate. A heat block contacts the front face for transferring generated heat from the electronic component to the working fluid to vaporize the working fluid. A condenser is in fluid communication with the chamber and connected to the rear face for condensing the vaporized working fluid back to a liquid. The assembly further includes an acute angle between the front face and the peripheral wall such that the chamber extends upwardly at an angle from the front face to the rear face to ensure complete coverage of the heat block with the cooling fluid in any position between horizontal and vertical.

25 Claims, 4 Drawing Sheets

ORIENTATION INSENSITIVE THERMOSIPHON ASSEMBLY FOR COOLING ELECTRONIC COMPONENTS

BACKGROUND OF THE INVENTION

1. Field of the Invention

The subject invention relates to a thermosiphon assembly for dissipating heat generated by an electronic component using a working fluid. Specifically, the subject invention relates to a thermosiphon that is operable in any position between horizontal and vertical.

2. Description of the Related Art

Various related art thermosiphon assemblies include an evaporator having a front face, a rear face, and a peripheral wall extending between the front face and the rear face. The peripheral wall defines a chamber containing the working fluid. A heat block is in contact with the front face for transferring generated heat from the electronic component to the working fluid to vaporize the working fluid. The assemblies also include a condenser in fluid communication with the chamber and connected to the rear face for condensing the vaporized working fluid back to a liquid and delivering the liquefied working fluid back to the chamber.

One such assembly, shown in U.S. Pat. No. 3,741,292, discloses a thermosiphon assembly being operable in a vertical position and a horizontal position. The assembly has an evaporator chamber in fluid communication with a condenser. The chamber is rectangularly shaped having right angles between the faces and the sides. The chamber requires a large volume of working fluid to ensure that the electronic components are covered in both the horizontal and vertical positions because it is rectangularly shaped. The large volume of working fluid does not dissipate the generated heat efficiently because it takes longer for the working fluid to heat up. The inadequate heat dissipation may result in a shorter life for the electronic component.

Another assembly, shown in U.S. Pat. No. 6,005,772, discloses a thermosiphon assembly having an evaporator, a condenser, a plurality of tubes interconnecting the evaporator and the condenser. However, in each of the disclosed embodiments the tubes are at right angles to the evaporator and the condenser. Therefore, the assembly requires large amounts of space in the electronic components for operation because of the separation between the condenser and the evaporator. Further, when the assembly is in the horizontal position, a large amount of working fluid is required and does not dissipate heat as efficiently. When the assembly is in the vertical position, the working fluid can flow into the connecting tubes, which decreases the ability of the assembly to dissipate heat because the condenser has less area to condense the vaporized working fluid.

Yet another assembly, shown in U.S. Pat. No. 5,925,929, discloses a thermosiphon assembly having a heat block with tubes extending therefrom. Each of the tubes is sealed with a working fluid disposed therein. The tube has an evaporator portion in contact with the heat block acting as an evaporator and a condenser portion extending beyond the heat block acting as a condenser. The tube may be angled between the evaporator region and the condenser region. This assembly does not ensure that the electronic components are covered with the working fluid in any position between horizontal and vertical, because the working fluid is only contained in each of the tubes. In the vertical position, the evaporator portion would have to be completely filled to cover the electronic components, but then in the horizontal position, the liquid working fluid would flow into the condenser portion. Also, there are spaces between the tubes where the electronic components are not in contact with the working fluid, because the tubes are narrow compared to the heat block. Therefore, heat dissipation from the electronic components is not evenly distributed throughout the heat block which may impact the performance of the electronic components.

These related art thermosiphon assemblies are characterized by one or more inadequacies. Therefore, it would be advantageous to provide a thermosiphon assembly that ensures complete coverage of the electronic components in any position between horizontal and vertical. It would also be advantageous to provide a thermosiphon assembly that evenly distributes the generated heat to the working fluid.

BRIEF SUMMARY OF THE INVENTION AND ADVANTAGES

The subject invention provides a thermosiphon assembly for dissipating heat generated by an electronic component using a working fluid. The assembly includes an evaporator having a front face and a rear face. A peripheral wall extends between the front face and the rear face for defining a chamber containing the working fluid. A heat block is in contact with the front face for transferring generated heat from the electronic component to the working fluid for vaporizing the working fluid. A condenser is in fluid communication with the chamber and connected to the rear face for condensing the vaporized working fluid back to a liquid and delivering the liquefied working fluid back to the chamber. The assembly includes an acute angle between the front face and the peripheral wall such that the chamber extends upwardly at an angle from the front face to the rear face for ensuring complete coverage of the electronic component with the working fluid when the heat block is in any position between vertical and horizontal.

Accordingly, the subject invention provides a thermosiphon assembly that ensures complete coverage of the electronic components in any position between horizontal and vertical and that evenly distributes the generated heat to the working fluid.

BRIEF DESCRIPTION OF THE SEVERAL VIEWS OF THE DRAWINGS

Other advantages of the present invention will be readily appreciated as the same becomes better understood by reference to the following detailed description when considered in connection with the accompanying drawings wherein.

DETAILED DESCRIPTION OF THE INVENTION

Figure 1:
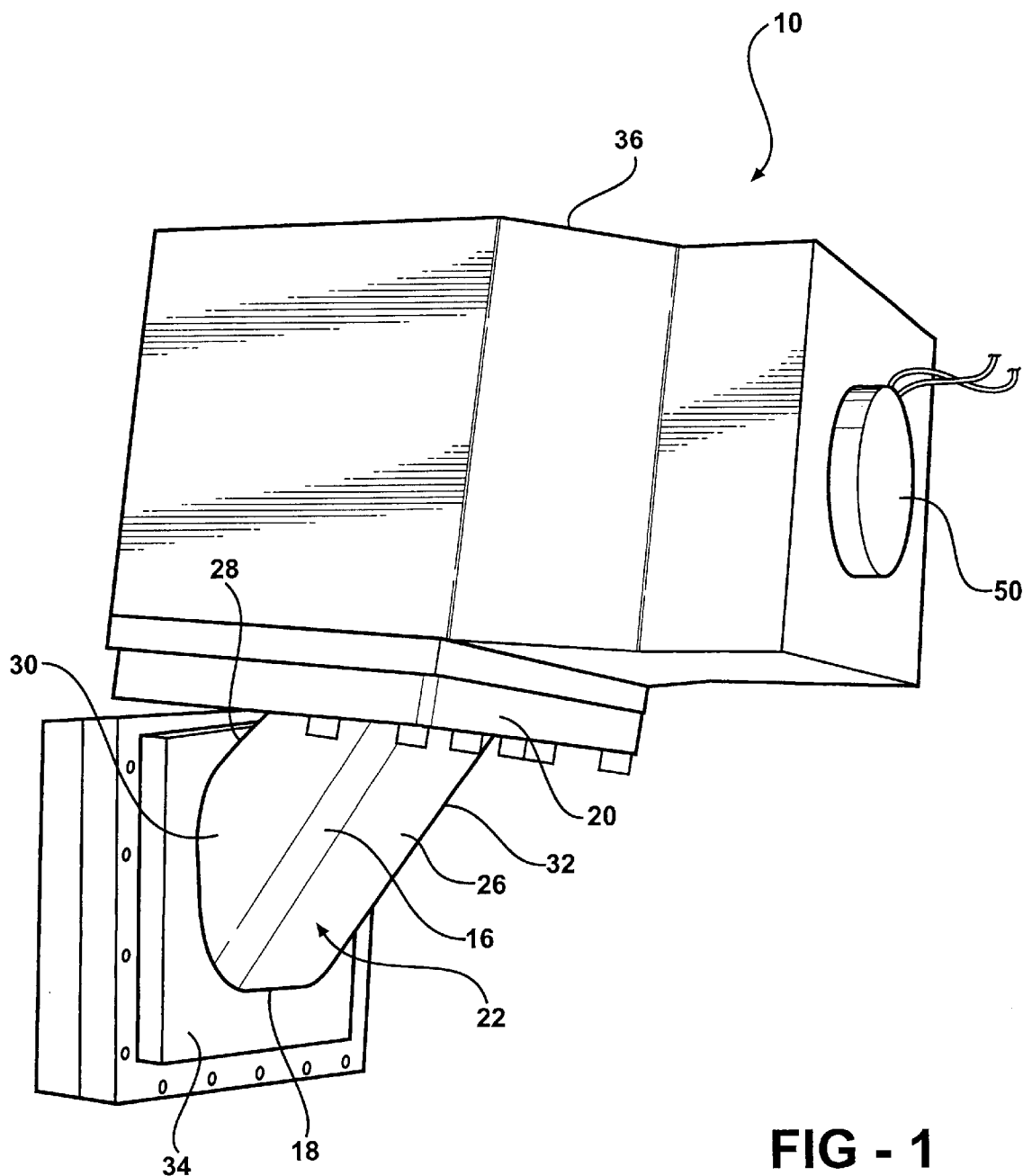
FIG. 1 is a perspective view of a thermosiphon assembly according to the subject invention being in a vertical position.

Referring to the Figures, wherein like numerals indicate like or corresponding parts throughout the several views, a thermosiphon assembly for dissipating heat is shown generally at 10 in FIG. 1. The assembly 10 is shown generally in FIG. 1 as including an evaporator 16 having a front face 18, a rear face 20, and a peripheral wall 22. A condenser 36 is in fluid communication with the evaporator 16. A fan 50 is connected to the condenser 36 for moving air through the condenser 36 thereby dissipating heat from the condenser 36.

Figure 2:
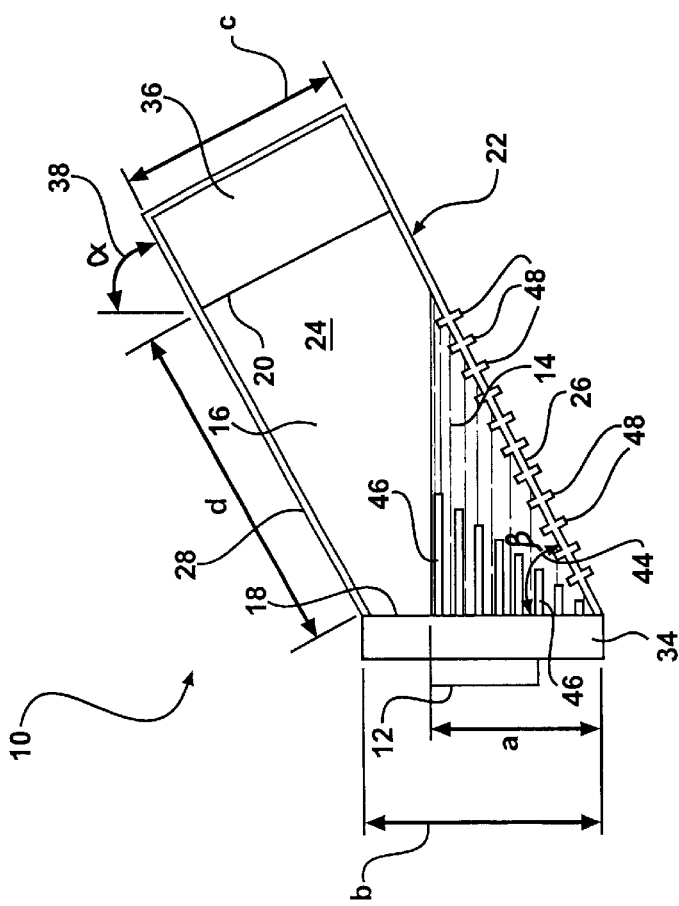
FIG. 2 is a side-view of another embodiment of a thermosiphon assembly according to the subject invention in a vertical position.

Referring to FIG. 2, a general schematic of the embodiment shown in FIG. 1 is illustrated. The heat to be dissipated is typically generated by an electronic component 12 and dissipated using a working fluid 14. The subject invention is particularly useful with electronic components 12 such as computer chips, microprocessor assemblies, telecommunication chips, and the like. These electronic components 12 are used in various electronic devices (not shown), such as computer systems, telecommunication systems, and the like. The electronic components 12 are preferably flexibly attached to the thermosiphon assembly 10. However, one skilled in the art may connect the electronic components 12 by other methods with deviating from the scope of the subject invention.

Typical working fluids 14 that may be employed with the subject invention include, but are not limited to, demineralized water, methanol, halocarbon fluids, and the like. One example of a possible halocarbon fluid is R134a. It is to be understood that one skilled in the art may select various working fluids 14 depending upon the amount of heat generated by the specific electronic component 12.

Figure 4:
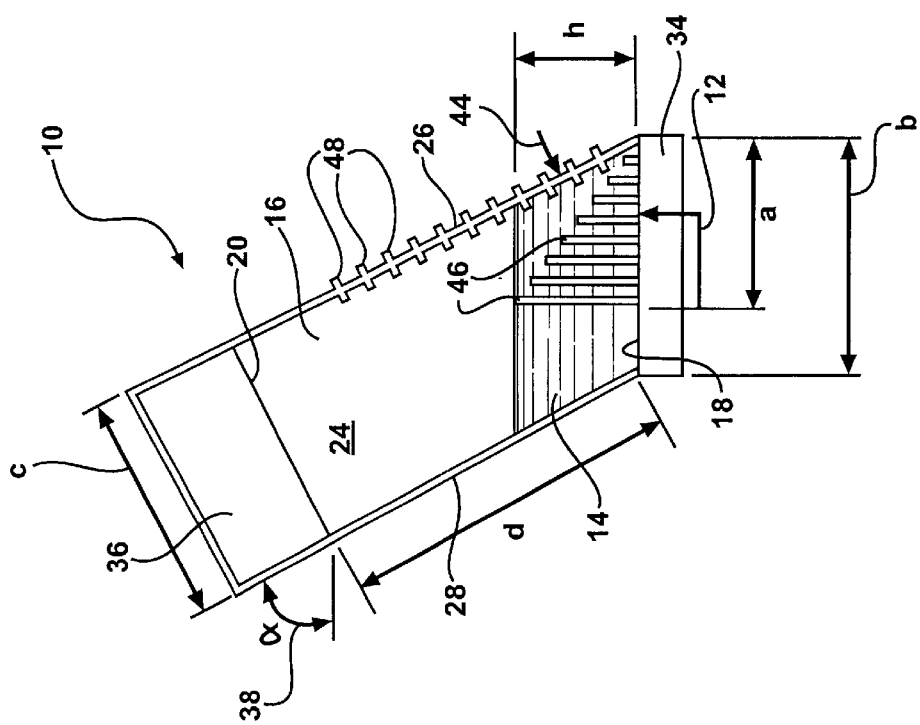
FIG. 4 is a side-view of the embodiment shown in FIG. 2 being in a horizontal position.

More specifically, FIG. 2 is a side view of one embodiment of the assembly 10 in a vertical position and FIG. 4 is a side view of the same embodiment of the assembly 10 in a horizontal position. The assembly 10 includes the evaporator 16 having the front face 18, the rear face 20, and the peripheral wall 22 extending between the front face 18 and the rear face 20. The evaporator 16 may be constructed of any type of metal, but it is preferably copper or aluminum. The different types of metal selected depend primarily upon the amount of heat that is generated by the electronic component 12 to be dissipated and the type of working fluid 14 that is used. The peripheral wall 22 defines a chamber 24 for containing the working fluid 14. In the preferred embodiment, the peripheral wall 22 further includes a first wall 26, a second wall 28, a third wall 30, and a fourth wall 32, with the first wall 26 being opposite the second wall 28. It is to be appreciated that one skilled in the art may alter the number of walls without deviating from the subject invention. For example, an evaporator 16 having a single, cylindrical wall may be capable of achieving the same results as that of the subject invention.

A heat block 34 contacts the front face 18 for transferring generated heat from the electronic component 12 to the working fluid 14 to vaporize the working fluid 14. The electronic component 12 is in contact with the heat block 34. The electronic component 12 may be removably connected or fixed to the heat block 34 depending upon the electronic device. The heat block 34 may also be formed as an integral part of the front face 18 or it may be removable from the front face 18 as a separate component. The heat block 34 is preferably constructed of a material, such as metal, having the ability to transfer heat. However, other types of materials may be capable of transferring heat, such as ceramics, and may be used in the subject invention.

The subject invention includes the condenser 36 in fluid communication with the chamber 24 and connected to the rear face 20. The condenser 36 condenses the vaporized working fluid 14 back to a liquid and delivers the liquefied working fluid 14 back to the chamber 24. The condenser 36 may be any type of condenser 36 known to those skilled in the art. The condenser 36 may be constructed of any type of metal, but it is preferably copper or aluminum. The different types of metal selected depend primarily upon the amount of heat that is generated by the electronic component 12 to be dissipated and the type of working fluid 14 that is used. The liquefied working fluid 14 returns to the chamber 24 under the force of gravity. Therefore, the condenser 36 is positioned at a predetermined angle 38 relative to the rear face 20. The predetermined angle 38 encourages the return of the liquefied working fluid 14 to the chamber 24 and prevents the liquefied working fluid 14 in the chamber 24 from entering the condenser 36. The predetermined angle 38 is selected from the range of 1 degree and 80 degrees, preferably from the range of 3 degree and 70 degrees, and more preferably from the range of 5 degree and 45 degrees.

The condenser 36 has a predetermined condenser width c, which is shown as being from the first side to the second side at the rear face 20. The heat block 34 has a predetermined block height b, which is shown as being from the first side to the second side at the front face 18. A larger condenser width c is able to condense more vaporized working fluid 14, however, it may require more cooling fluid flow. A larger block height b dissipates additional generated heat. It is important that the condenser width c and the block height b be selected with the other in mind. If the condenser width c is too small, and the block height b too large, efficient heat transfer will not occur. Accordingly, the predetermined condenser width c and the predetermined block height b are present in a ratio of from 0.5:1 to 5:1 of the predetermined condenser width c to the predetermined block height b, preferably in a ratio of from 0.5:1 to 3:1, and more preferably in a ratio of from 1:1 to 2:1. In other words, the condenser width c may be twice as wide as the heat block 34 is high.

The assembly 10 includes an acute angle 44 between the front face 18 and the peripheral wall 22 such that the chamber 24 extends upwardly at an angle from the front face 18 to the rear face 20. The angled chamber 24 ensures complete coverage of the electronic component 12 with the working fluid 14 when the heat block 34 is in any position between vertical and horizontal. In FIG. 2, the working fluid 14 forms a generally triangular shape and has a volume per unit depth defined by the following equation:

$$\frac{\text{Volume}}{\text{unit depth}} = \frac{a^2 \tan\beta}{2}$$

where a is the distance between the end of the heat block 34 nearest the acute angle 44 and the end of the electronic component 12 opposite the acute angle 44, and where β is the measurement of the acute angle 44. In FIG. 4, the working fluid 14 forms a parallelogram and has a volume per unit depth defined by the following equation:

$$\text{Volume/unit depth} = h \times b$$

where h is the height of the working fluid 14 in the chamber 24 and b is the height of the heat block 34. Because it is difficult to measure the height of the working fluid 14 in the closed chamber 24, h can be calculated by equating these two equations, resulting in the following equation:

$$h = \frac{a^2\tan\beta}{2b}$$

In order to optimize efficiency of the assembly 10, the length of the evaporator 16 can be determined according to the following equation:

$$d \geq \frac{a^2}{2bc\cos\beta}$$

where d is the length of the evaporator 16. Also, in optimizing the assembly 10, the condensed working fluid 14 should be prevented from entering the condenser 36. In order to make sure that the evaporator 16 is long enough and not angled upwardly too much, the evaporator 16 should satisfy the following equation:

$$h \leq d \sin \beta$$

Figure 3:
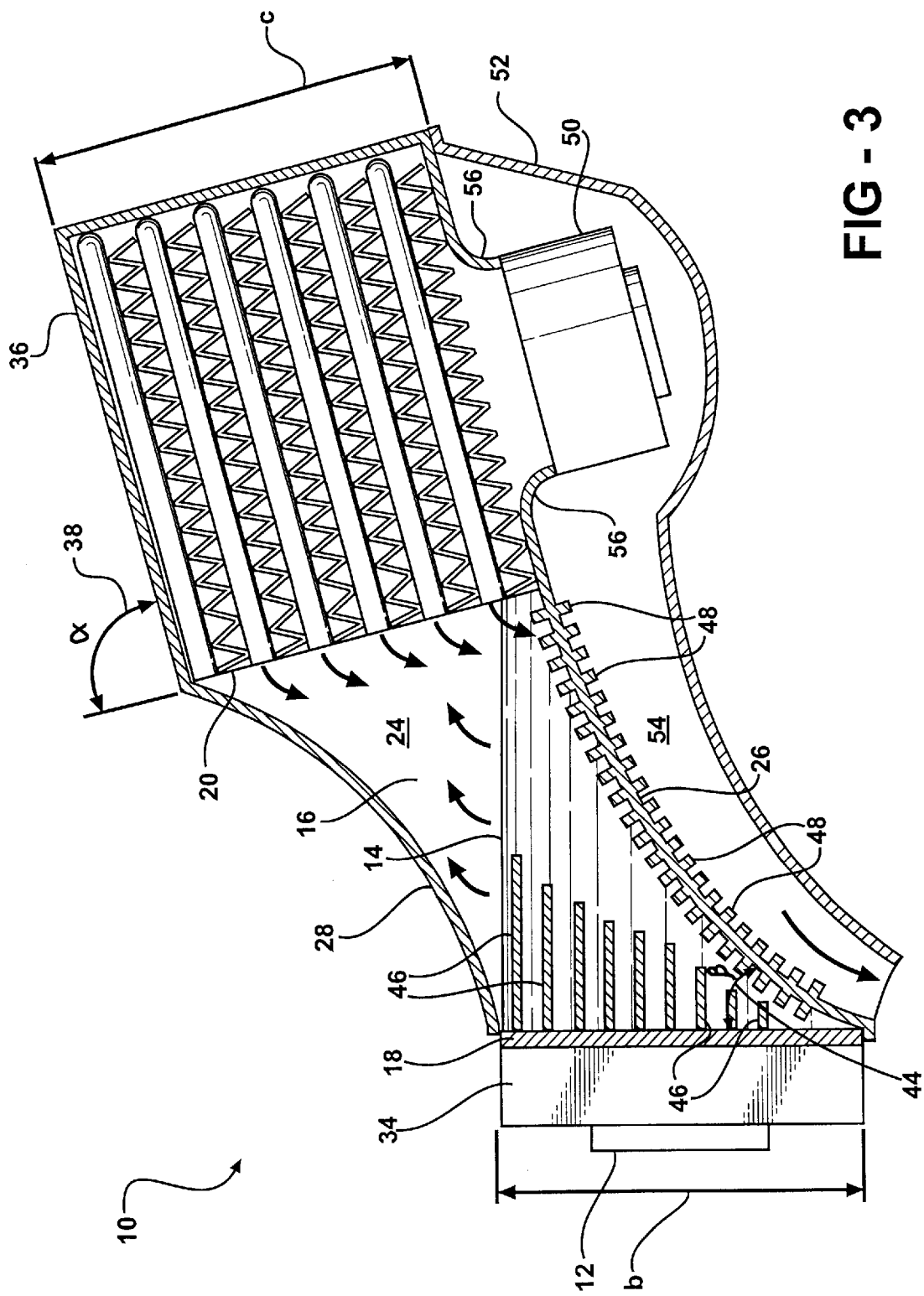
FIG. 3 is a side-view of yet another thermosiphon assembly according to the subject invention having an arcuate peripheral wall and being in a vertical position.
Figure 5:
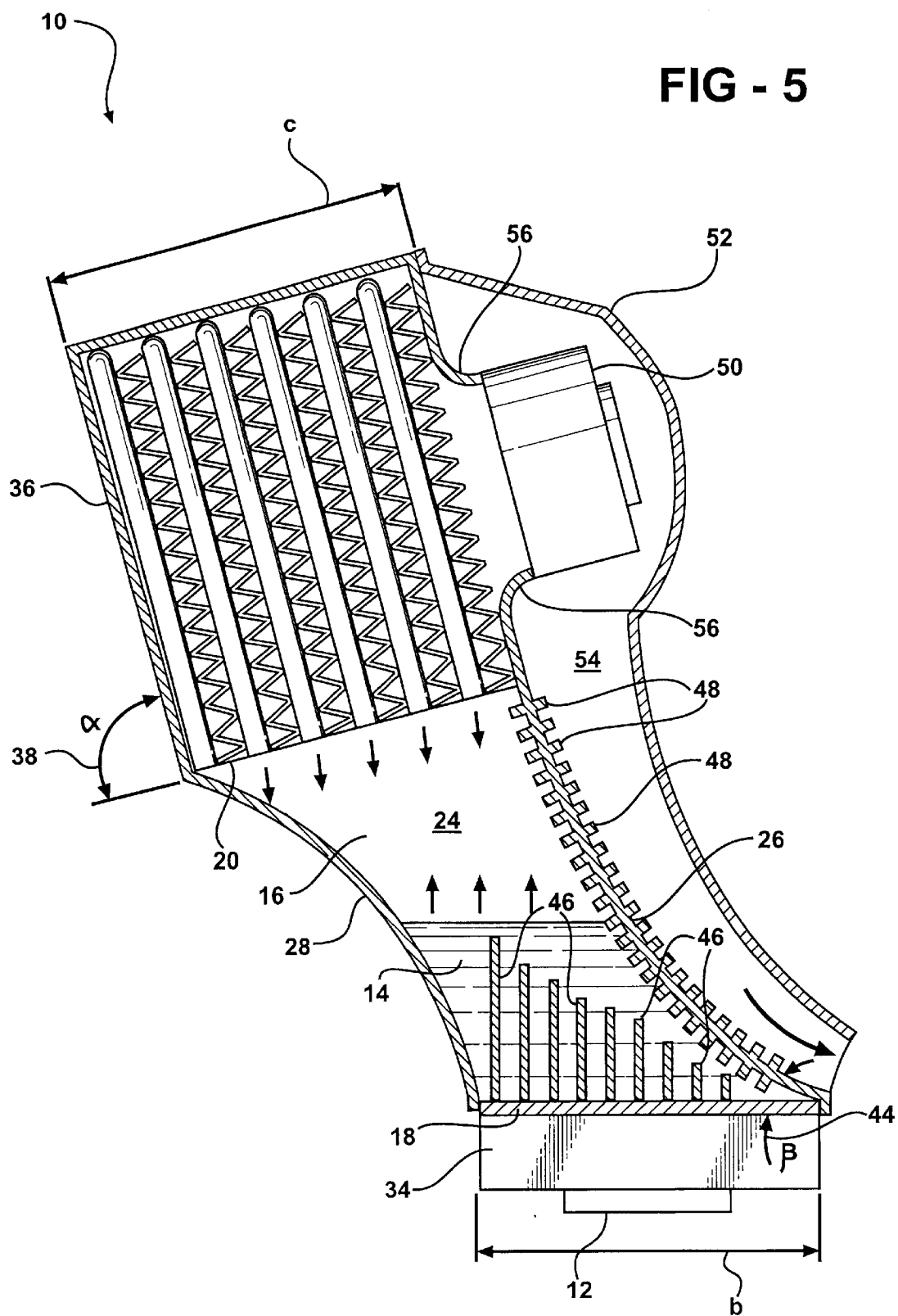
FIG. 5 is a side-view of the embodiment shown in FIG. 3 being in a horizontal position.

FIG. 3 shows another embodiment of the assembly 10 in the vertical position and FIG. 5 shows the same embodiment of the assembly 10 in the horizontal position. In FIGS. 3 and 5, the peripheral wall 22 is arcuate. More specifically, the first wall 26 and the second wall 28 are arcuate. It is to be appreciated that only the first wall 26 may be arcuate, while the second wall 28 is straight, while still achieving the subject invention. Alternately, the second wall 28 may be arcuate while the first wall 26 is straight. One factor that may effect the amount of arc in the peripheral wall 22, is the ratio of the condenser width c to the block height b. If the wall was straight and the ratio was large, then the volume of the working fluid 14 may not completely cover the heat block 34 or electronic component 12. In the embodiment shown in FIGS. 3 and 5, the working fluid 14 completely covers the heat block 34 and therefore ensures maximum heat transfer. This allows the electronic component 12 to be placed anywhere on the heat block 34. However, optimal heat transfer occurs when the electronic component 12 is placed in the middle of the heat block 34.

The subject invention also includes a plurality of internal fins 46 positioned within the chamber 24 and extending from the front face 18 into the working fluid 14 for transferring maximum heat from the heat block 34 to the working fluid 14. The plurality of internal fins 46 may vary in height from the first wall 26 to the second wall 28. Preferably, the internal fins 46 nearest the first wall 26 are the shortest and the internal fins 46 nearest the second wall 28 are the longest. Referring to FIGS. 2 and 4, the internal fins 46 are shortest at the acute angle 44 and become longer toward the second wall 28. However, the internal fins 46 stop short of reaching the second wall 28 and only extend to the location of the electronic component 12. Whereas in FIGS. 3 and 5, the internal fins 46 extend across the entire front face 18 from the first wall 26 to the second wall 28. In each of the embodiments, each of the plurality of internal fins 46 is submerged in the working fluid 14 in any position of the heat block 34 between vertical and horizontal.

Cooling fins 48 extend from one of the walls into and out of the chamber 24 for transferring heat from the vaporized working fluid 14 to surrounding cooling fluid. In the preferred embodiment, the cooling fins 48 extend from the first wall 26 such that a portion of the cooling fins 48 are in contact with the working fluid 14 in the chamber 24 and another portion is in contact with the cooling fluid. Any number of cooling fins 48 may extend from the first wall 26 and may be any length depending upon the amount of heat to be dissipated. The condenser 36 has a cooling area that is determined by the length and number of cooling tubes, as is known in the art. However, if less heat needs to be dissipated, then the cooling area of the cooling fins 48 may be less than that of the condenser 36.

Referring again to FIGS. 3 and 5, the subject invention may also include the fan 50 mounted adjacent the condenser 36 for inducing a flow of cooling fluid through the condenser 36 to increase the transfer of heat from the vaporized working fluid 14. The cooling fluid is typically air, but other fluids may be utilized. The assembly 10 may also include an external wall 52 adjacent the fan 50 and the cooling fins 48. The external wall 52 defines a cooling fluid channel 54 for directing the flow of cooling fluid flow across the cooling fins 48. The cooling fluid channel 54 is in fluid communication with the condenser 36 such that the cooling fluid passing through the condenser 36 passes through the cooling fluid channel 54 and along the cooling fins 48. In order to increase the flow of cooling fluid through the condenser 36, the condenser 36 may have a curved wall 56 disposed between the condenser 36 and the fan. The curved wall 56 channels the cooling fluid into the cooling fluid channel 54. Alternately, the fan 50 may be replaced by a blower or similar device. Instead of pulling air through the condenser 36 and funneling it into the cooling fluid channel 54, it could be blown through each.

Obviously, many modifications and variations of the present invention are possible in light of the above teachings. The invention may be practiced otherwise than as specifically described within the scope of the appended claims.

What is claimed is:

1. A thermosiphon assembly for dissipating heat generated by an electronic component using a working fluid, said assembly comprising:

an evaporator having a front face, a rear face, and a peripheral wall extending between said front face and said rear face for defining a chamber containing the working fluid;

a heat block in contact with said front face for transferring generated heat from the electronic component to the working fluid to vaporize the working fluid;

a condenser in fluid communication with said chamber and connected to said rear face for condensing the vaporized working fluid back to a liquid and delivering the liquefied working fluid back to said chamber; and an acute angle between said front face and said peripheral wall such that said chamber extends upwardly at an angle from said front face to said rear face for ensuring complete coverage of the electronic component with the working fluid when said heat block is in any position between vertical and horizontal.

2. An assembly as set forth in claim 1 wherein said peripheral wall is further defined as being arcuate.

3. An assembly as set forth in claim 1 wherein said peripheral wall further includes a first wall, a second wall, a third wall, and a fourth wall.

4. An assembly as set forth in claim 3 wherein said first wall is further defined as being arcuate.

5. An assembly as set forth in claim 4 wherein said second wall is further defined as being arcuate.

6. An assembly as set forth in claim 5 wherein said first wall and said second wall are further defined as being opposite one another.

7. An assembly as set forth in claim 1 wherein said condenser is positioned at a predetermined angle relative to said rear face for preventing the liquefied working fluid in said chamber from entering the condenser.

8. An assembly as set forth in claim 7 wherein said predetermined angle is selected from the range of 1 degree and 80 degrees.

9. An assembly as set forth in claim 7 wherein said predetermined angle is selected from the range of 3 degree and 70 degrees.

10. An assembly as set forth in claim 7 wherein said predetermined angle is selected from the range of 5 degree and 45 degrees.

11. An assembly as set forth in claim 1 wherein said predetermined volume of the working fluid completely covers said heat block for ensuring maximum heat transfer independent of the location of the electronic component on said heat block.

12. An assembly as set forth in claim 1 wherein said condenser further includes a predetermined condenser width and wherein said heat block further includes a predetermined block height.

13. An assembly as set forth in claim 12 wherein said predetermined condenser width and said predetermined block height are present in a ratio of from 0.5:1 to 5:1 of said predetermined condenser width to said predetermined block height.

14. An assembly as set forth in claim 12 wherein said predetermined condenser width and said predetermined block height are present in a ratio of from 0.5:1 to 3:1 of said predetermined condenser width to said predetermined block height.

15. An assembly as set forth in claim 12 wherein said predetermined condenser width and said predetermined block height are present in a ratio of from 1:1 to 2:1 of said predetermined condenser width to said predetermined block height.

16. An assembly as set forth in claim 3 further including a plurality of internal fins positioned within said chamber and extending from said front face into the working fluid for transferring maximum heat from said heat block to the working fluid.

17. An assembly as set forth in claim 16 wherein said plurality of internal fins vary in height from said first wall to said second wall.

18. An assembly as set forth in claim 17 wherein said plurality of internal fins are shortest near said first wall and longest near said second wall.

19. An assembly as set forth in claim 17 wherein each of said plurality of internal fins is submerged in the working fluid in any of the position of said heat block between vertical and horizontal.

20. An assembly as set forth in claim 3 further including cooling fins extending from one of said walls into and out of said chamber for transferring heat from the vaporized working fluid to surrounding cooling fluid outside of said chamber.

21. An assembly as set forth in claim 20 wherein said cooling fins are further defined as extending from said first wall.

22. An assembly as set forth in claim 21 further including a fan mounted adjacent said condenser for inducing a flow of cooling fluid through said condenser to increase the transfer of heat from the vaporized working fluid.

23. An assembly as set forth in claim 22 further including an external wall supported by said assembly adjacent said fan and said cooling fins and defining a cooling fluid channel for directing the flow of cooling fluid flow across said cooling fins.

24. An assembly as set forth in claim 23 wherein said cooling fluid channel is in fluid communication with said condenser such that the cooling fluid passing through said condenser passes through said cooling fluid channel.

25. An assembly as set forth in claim 24 further including a curved wall disposed between said condenser and said fan for increasing an amount of cooling fluid passing through said condenser.

* * * * *